US005635671A

United States Patent [19]
Freyman et al.

[11] Patent Number: 5,635,671
[45] Date of Patent: Jun. 3, 1997

[54] MOLD RUNNER REMOVAL FROM A SUBSTRATE-BASED PACKAGED ELECTRONIC DEVICE

[75] Inventors: Bruce J. Freyman, Tempe; John Briar, Phoenix, both of Ariz.; Young W. Heo, Seongnam; Il K. Shim, Seoul, both of Rep. of Korea

[73] Assignees: Amkor Electronics, Inc., Chandler, Ariz.; Anam Industrial Co., Ltd., Seoul, Rep. of Korea

[21] Appl. No.: 214,339

[22] Filed: Mar. 16, 1994

[51] Int. Cl.⁶ .................................................. H01L 23/28
[52] U.S. Cl. .......................... 174/52.2; 257/787; 257/788; 361/760
[58] Field of Search .......... 29/827, 841; 174/52.1–52.4; 257/779, 787, 788; 361/748, 749, 760–762; 437/183

[56] References Cited

U.S. PATENT DOCUMENTS

| | | |
|---|---|---|
| 4,954,308 | 9/1990 | Yabe et al. . |
| 5,099,101 | 3/1992 | Millerick et al. ................. 219/121.82 |
| 5,241,133 | 8/1993 | Mullen, III et al. . |
| 5,311,402 | 5/1994 | Kobayashi et al. ................ 361/760 |
| 5,317,196 | 5/1994 | Wong ................................ 257/791 |
| 5,324,474 | 6/1994 | Gupta .............................. 264/328.1 |
| 5,478,517 | 12/1995 | Erdos .............................. 264/161 |

*Primary Examiner*—Bot L. Ledynh
*Attorney, Agent, or Firm*—Skjerven, Morrill, MacPherson, Franklin & Friel LLP

[57] ABSTRACT

According to the invention, an electronic device mounted on a substrate is encapsulated using a standard two-piece mold. A novel degating region is formed on a surface of the substrate to allow removal of excess encapsulant formed on the surface during molding without damaging the remainder of the device. The material of the degating region that contacts the encapsulant forms a weak bond with the encapsulant, relative to the bond formed between the encapsulant and the substrate, so that the encapsulant can be peeled away from the degating region without damaging the substrate or other portion of the device. The degating region is provided without introducing additional steps into the process for forming the device. The presence of the degating region eliminates the necessity of using a three-piece or modified two-piece mold to achieve top gating in order to degate without damaging the device. In one embodiment, the degating region is made of gold. Gold has an adhesive force with typical encapsulant materials that is approximately 10% of the adhesive force between the typical encapsulant materials and typical substrate materials.

17 Claims, 11 Drawing Sheets

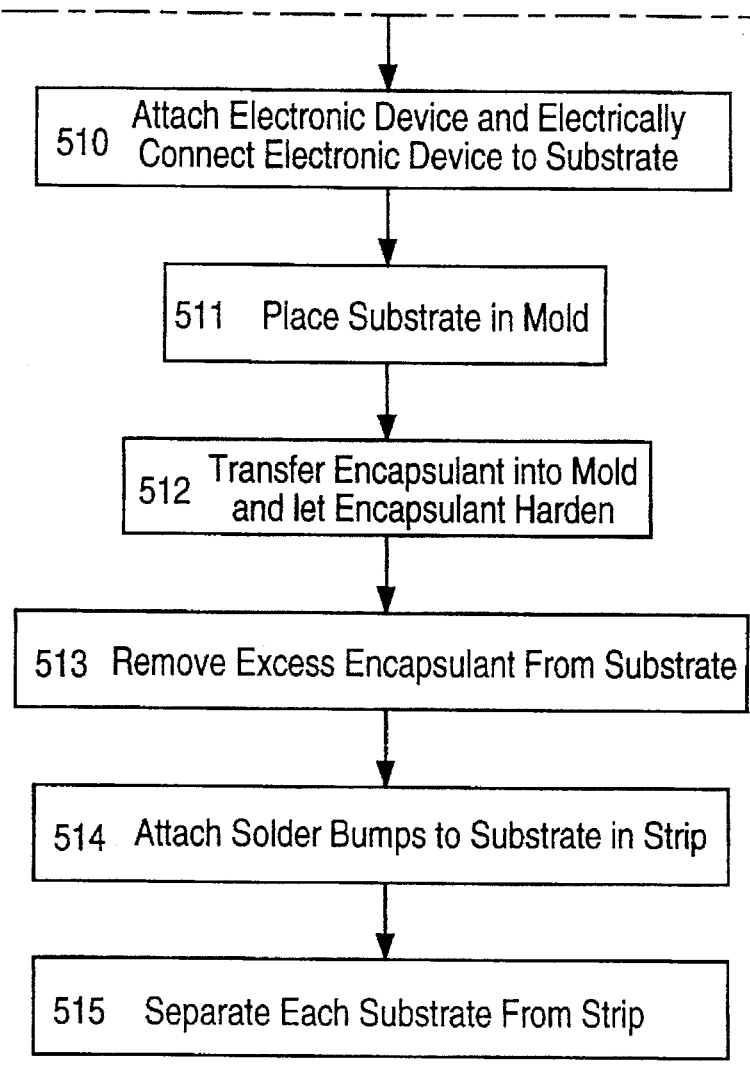
Figure 5B
Figure 5
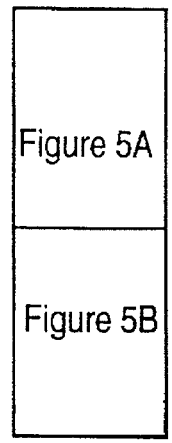

MOLD RUNNER REMOVAL FROM A SUBSTRATE-BASED PACKAGED ELECTRONIC DEVICE

BACKGROUND OF THE INVENTION

1. Field of the Invention

This invention relates to packaged electronic devices such as packaged integrated circuit chips. In particular, the invention relates to manufacture of a substrate-based packaged electronic device in which encapsulant is formed over the electronic device, such that excess encapsulant can be removed without damaging the packaged electronic device.

2. Related Art

As integrated circuits have become more complex, a need has arisen for a packaged integrated circuit having a large number of high density, reliable external package connections. It is also desirable to include in a packaged integrated circuit one or more conductive layers for signal routing and/or provision of ground and/or power planes. To meet these needs, the ball grid array has been developed.

FIG. 1 is a cross-sectional view of a typical ball grid array 100. A semiconductor die 101 is attached to a surface (die attach surface) 102a of a substrate 102, e.g., a printed circuit board (PCB), with adhesive (not shown). Electrically conductive bond pads (not shown) on the die 101 are connected with electrically conductive bond wires 103 to electrically conductive traces 102b and/or electrically conductive regions (not shown) formed on the die attach surface 102a of the substrate 102. Electrically conductive vias 102c are formed through the substrate 102 from the traces 102b and/or regions on the die attach surface 102a to a surface (mounting surface) 102d of the substrate 102 opposite the die attach surface 102a. Electrically conductive traces 102e formed on the mounting surface 102d extend to solder pads 102f formed on the mounting surface 102d. On of a plurality of solder bumps 104 are formed on each of the solder pads 102f. The solder bumps 104 are reflown to attach the substrate 102 to a larger mounting board (not shown).

An encapsulant 105 such as plastic is formed to enclose the semiconductor die 101, the bond wires 103 and a portion of the die attach surface 102a of the substrate 102 including most of the traces 102b and/or regions. The vias 102c are outside the encapsulant 105. The encapsulant 105 is frequently formed by an injection or transfer molding process.

It would be desirable to use conventional two-piece molding equipment to form the encapsulant over the die in a ball grid array. Two-piece molding equipment is already widely used for plastic encapsulation of other semiconductor devices. Thus, use of two-piece mold equipment reduces manufacturing costs since a large amount of such equipment is already in place in manufacturing facilities and the associated processes are well understood. Further, the use of two-piece molding equipment can easily be, and has been, automated, thus reducing manufacturing costs even more.

FIGS. 2A and 2B are cross-sectional views of a conventional two-piece mold 201. FIG. 2A is viewed along sectional line 2B—2B of FIG. 2B. FIG. 2B is viewed along sectional line 2A—2A of FIG. 2A.

The mold 201 includes a first mold section 202 (upper mold section as shown in FIG. 2A) and a second mold section 203 (lower mold section as shown in FIG. 2A). A recess 203a is formed in the lower mold section 203 in which a substrate 206 is positioned. A semiconductor die 207 is attached to the substrate 206. A cavity 202a is formed in the upper mold section 202 so that when the upper mold section 202 and the lower mold section 203 are brought into contact, the semiconductor die 207 is positioned within the cavity 202a.

The lower mold section 203 is formed with a pot 203b in which a pellet of solid encapsulant 205 is placed. The upper mold section 202 is formed with a hole 202d through which a transfer ram 204 movably extends. The transfer ram 204 is positioned above the encapsulant 205 in the pot 203b. A runner 202b in the upper mold section 202 extends from the hole 202d to the cavity 202a.

Though not shown completely in FIGS. 2A and 2B, another runner 202e can extend from the hole 202d opposite the location from which the runner 202b extends. The runner 202e extends to a cavity (not shown, but diametrically opposed, in one embodiment, to cavity 202a) which encloses a die (not shown) that is attached to a substrate (not shown) mounted in a recess (not shown) in the lower mold section 203, in the same manner as described above. Though two runners 203b and 203e are shown in FIG. 2A, any appropriate number of runners can extend from hole 202d to other cavities such as cavity 202a, i.e., one, three or more. Further, the mold 201 can include a plurality of pots, each pot having one or more runners extending to one or more cavities as described above.

After the substrate 206 is positioned in the recess 203a of the lower mold section 203, the encapsulant 205 is positioned in the pot 203b, and the upper mold section 202 and the lower mold section 203 are brought into contact with each other. Then the transfer ram 204 is moved (down in FIG. 2A) through the hole 202d to compress the encapsulant 205. The mold 200 and encapsulant 205 are pre-heated so that when the transfer ram 204 compresses the encapsulant 205, the liquefied encapsulant 205 is forced through the runner 202b to fill the cavity 202a. After the encapsulant 205 fills the cavity 202a, the encapsulant 205 is cured to harden, forming a packaged device. The transfer ram 204 is withdrawn, the upper mold section 202 and the lower mold section 203 are separated and the packaged device including substrate 206 is removed from the lower mold section 203.

As is apparent from inspection of FIGS. 2A and 2B, when the packaged device including substrate 206 is removed from the lower mold section 203, the encapsulant 205 not only encloses the die 207 ("package encapsulant"), but also extends along the surface of the substrate 206, where the runner 202b was located, and into the pot 203b. The excess encapsulant, i.e., encapsulant other than that necessary to enclose the die 207, must be removed. However, when the excess encapsulant is peeled away from the substrate surface, the encapsulant adheres to the substrate surface, twisting the substrate and tearing or rupturing the substrate surface, thereby causing damage to the packaged device which can be cosmetic (e.g., marring of the substrate surface) and/or functional (e.g., fracturing of the substrate; destruction of the electrically conductive traces on the substrate surface; tearing away of the solder mask on the substrate surface to undesirably expose, for instance, copper; and/or weakening or breaking of the seal between the encapsulant and the substrate surface).

Further, in production, it is desirable to integrally form a plurality of substrates in a strip having alignment holes that are located on tooling pins of a fixture, so that the packaging process (including encapsulation) can be automated. The excess encapsulant must be removed from the strip prior to further processing since, if left attached to the strip, the excess encapsulant extends past the edge of the strip prohibiting automated handling in subsequent processes.

Adherence of the excess encapsulant to the substrate during removal of the excess encapsulant may cause torquing of the strip that distorts the strip and renders the strip unusable for further processing.

Thus, standard two-piece molds cannot currently be used for forming encapsulant over substrate-based packaged electronic devices as described above. Presently, the encapsulant for such devices is formed over the die using either a three-piece mold, or a modified two-piece mold such as is illustrated in U.S. Pat. No. 4,954,308 to Yabe et al.

FIG. 3 is a cross-sectional view of one type of three-piece mold 301. The mold 301 includes a first mold section 302 (upper mold section as shown in FIG. 3), a second mold section 303 (lower mold section as shown in FIG. 3), and a gate plate 308. A recess 303a is formed in the lower mold section 303 in which a substrate 306 is positioned. A semiconductor die 307 is attached to the substrate 306. The gate plate 308 is positioned in the recess 303a on the substrate 306 to surround the die 307 and define a cavity 308a that is formed when the upper mold section 302 and the lower mold section 303 are brought into contact.

Similarly to the mold 201 described above, the lower mold section 303 includes a pot 303b in which a pellet of solid encapsulant 305 is placed. Runners 303c and 308b are formed in the lower mold section 303 and the gate plate 308, respectively, to extend from the pot 303b to the cavity 308a. A transfer ram 304 is moved (down in FIG. 3) through a hole 302a in the upper mold section 302 to compress the encapsulant 305 and force the encapsulant 305 through the runners 303c and 308b to fill the cavity 308a. The encapsulant 305 hardens, the transfer ram 304 is withdrawn, the upper mold section 302 and the lower mold section 303 are separated, the gate plate 308 is removed, and the packaged device including substrate 306 is removed from the lower mold section 303.

The use of the gate plate 308 enables the excess encapsulant associated with the runners 303c and 308b to be kept off of the surface of the substrate 306, i.e., the mold 301 is top-gated. Thus, the excess encapsulant can be separated from the package encapsulant that encloses the die 307 without damaging the packaged device.

However, the use of the three-piece mold 301 is costly and presents additional problems. First, it is difficult—if not impossible—to automate a molding process using the three-piece mold 301. Consequently, the throughput, i.e., number of electronic devices encapsulated per unit time, is decreased significantly as compared to a conventional two-piece mold. Thus, use of a three-piece mold is not viable for use in high volume production. Additionally, it is not possible to form a radius at the top corner of the package encapsulant, shown as 305a in FIG. 3, with a three-piece mold. Such a radius is helpful in removing the packaged device from the mold. Finally, though molding using corner gating is desirable because corner gating provides the best mold cavity filling profile, it is not practical to use corner gating with a three-piece mold.

SUMMARY OF THE INVENTION

According to the invention, an electronic device mounted on a substrate is encapsulated using a conventional two-piece mold. A novel degating region formed on a surface of the substrate bonds weakly with the encapsulant, relative to the bond formed between the encapsulant and the substrate, allowing removal of excess encapsulant formed on the substrate surface during molding without damaging the remainder of the packaged electronic device.

The degating region is provided without introducing additional steps into the process for forming the packaged electronic device. This is because the material of the degating region is the same material and is applied at the same time as material used to plate other electrically conductive material formed on the substrate. Thus, the invention provides good degating at no additional cost.

The presence of the degating region eliminates the necessity of using a three-piece or modified two-piece mold to achieve top gating in order to degate without damaging the packaged electronic device. Consequently, the problems associated with three-piece and modified two-piece molds, such as low throughput and increased mold complexity, are avoided. Further, the method according to the invention allows the large amount of existing two-piece mold equipment to be used, thus reducing production costs. Either conventional or automatic two-piece molds can be used with the invention.

A substrate-based packaged electronic device according to the invention includes a substrate, an electronic device attached to a first surface of the substrate, and encapsulant formed on the first surface of the substrate to enclose the electronic device. The encapsulant material and the degating region material that contacts the encapsulant are chosen such that the adhesive force between the encapsulant material and the degating region material is less than the adhesive force between the encapsulant material and the substrate material. Preferably, the adhesive force between the encapsulant material and the degating region material is less than one half the adhesive force between the encapsulant material and the substrate material and, most preferably, approximately 10% of the adhesive force between the encapsulant material and the substrate material. In one embodiment, the degating region to which the encapsulant making up the to-be-removed gate is attached is gold. In another embodiment, the degating region is palladium.

In a method according to the invention, an electronic device attached to a surface of a substrate is encapsulated to form a packaged electronic device by the steps of: 1) forming a degating region on the substrate surface; 2) forming an encapsulant on the substrate surface to enclose the electronic device, the encapsulant material and the degating region material being chosen such that the adhesive force between the encapsulant material and the degating region material that contacts the encapsulant is less than the adhesive force between the encapsulant material and the substrate material; and 3) removing encapsulant formed on the degating region such that the electronic device remains enclosed by the encapsulant and the packaged electronic device is not damaged.

BRIEF DESCRIPTION OF THE DRAWINGS

FIG. 2A is viewed along sectional line 2B—2B of FIG. 2B. FIG. 2B is viewed along sectional line 2A—2A of FIG. 2A.

DETAILED DESCRIPTION OF EMBODIMENTS OF THE INVENTION

According to the invention, a substrate-based packaged electronic device, such as a ball grid array, is produced using a standard two-piece mold. A novel degating region is formed on a surface of the substrate, e.g, printed circuit board (PCB), that allows removal of excess encapsulant formed on the surface during molding without damaging the remainder of the packaged electronic device. The material of the novel degating region forms a weak bond with the encapsulant, relative to the bond formed between the encapsulant and the substrate, so that the encapsulant can be peeled away from the degating region without damaging the substrate or other portion of the packaged electronic device.

Figure 4:
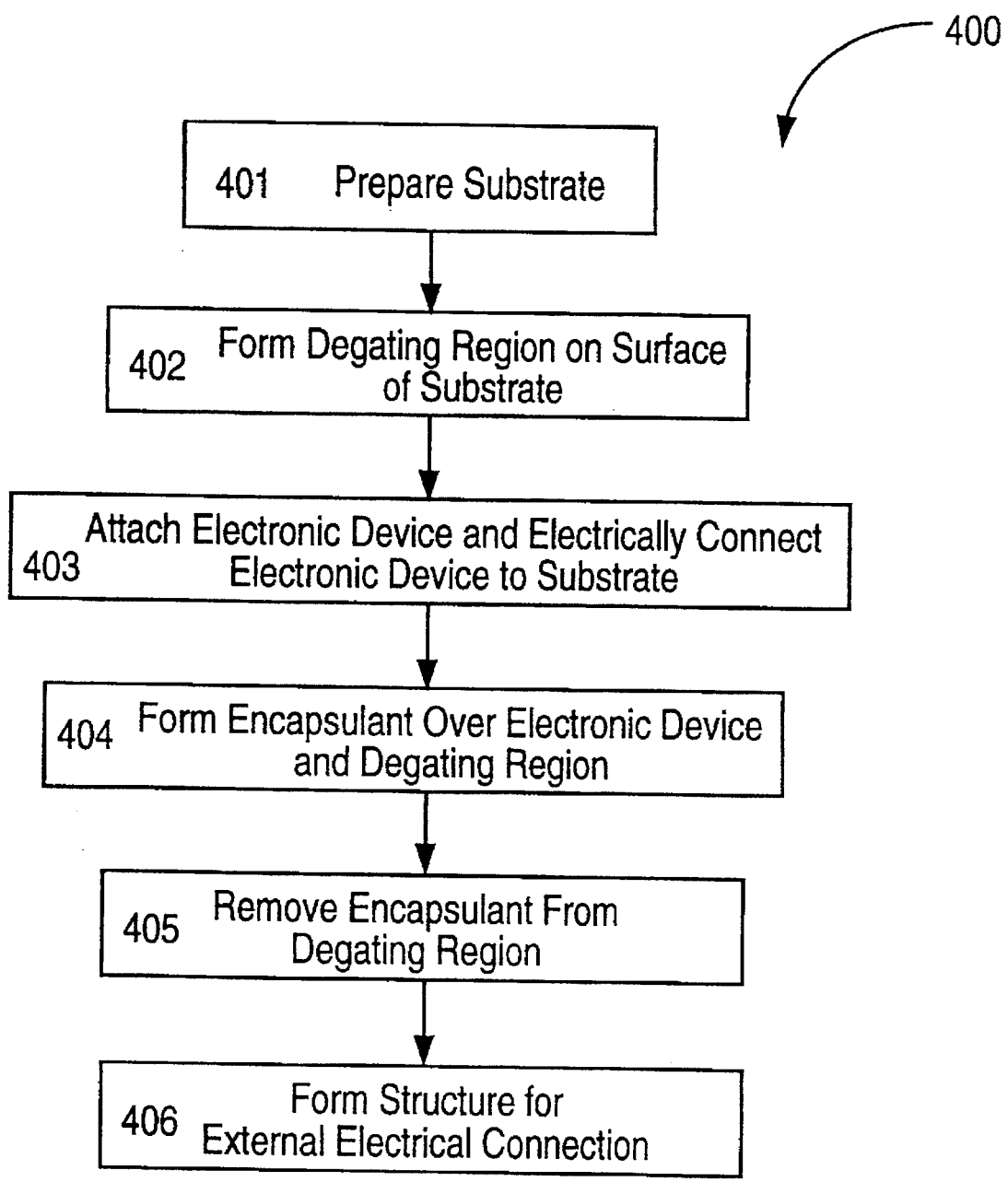
FIG. 4 is a block diagram of a process according to an embodiment of the invention for forming a substrate-based packaged electronic device such as a ball grid array.

FIG. 4 is a block diagram of process 400 according to an embodiment of the invention for forming a substrate-based packaged electronic device such as a ball grid array.

In step 401, a substrate is prepared, as explained in more detail below with respect to FIG. 5 for one particular embodiment of the invention. Briefly, a surface of the substrate is patterned with an electrically conductive material, e.g., a metal such as copper, and some of the patterned areas are covered with an electrically insulative material. Vias and through-holes are formed in the substrate to interconnect electrically conductive material formed on opposite sides of the substrate.

In step 402, a degating region is formed on a surface of the substrate to which an electronic device is to be attached. The degating region extends from the edge of the substrate to a location that, in the completed device, is at the edge of the encapsulant ("package encapsulant") formed on the substrate surface to cover the electronic device. The degating region is located so that, when the substrate is placed in a mold, a mold runner is positioned over the degating region, the area of the substrate surface covered by the degating region fully encompassing the area covered by the mold runner. The degating region material that contacts the encapsulant is chosen to be a material that adheres poorly to the encapsulant material as compared to the adhesion between the encapsulant material and the substrate material.

In step 403, an electronic device, such as an integrated circuit chip, is attached to the substrate surface in a device attach area. Attachment of the electronic device is performed using conventional materials and processes. The electronic device is also electrically connected to electrically conductive material formed in or on the surface of the substrate, using any of a number of conventional techniques such as wirebonding, flip chip connection (C4) or TAB.

In step 404, encapsulant is formed on the substrate surface to enclose the electronic device and at least a portion of the degating region, as explained in more detail below. Briefly, the substrate is placed in a mold such that the electronic device is positioned in a mold cavity. Encapsulant is transferred into the mold cavity through the mold runner until the cavity is filled. The encapsulant hardens and the mold is opened. Excess encapsulant is formed on the substrate surface where the mold runner was positioned when the substrate was in the mold and the mold closed.

In step 405, the excess encapsulant is removed from the substrate surface. The mold runner is dimensioned such that the encapsulant has a small cross-sectional area at the interface between the excess encapsulant and the package encapsulant. The excess encapsulant is peeled away from the surface of the substrate and broken away from the package encapsulant enclosing the electronic device at the interface between the excess encapsulant and the package encapsulant.

Because the degating region is formed of a material that adheres poorly to the encapsulant material, the excess encapsulant peels cleanly away from the degating region. Further, the degating region material and the small encapsulant cross-section at the interface between the excess encapsulant and package encapsulant enable the excess encapsulant to be broken away easily from the package encapsulant without pulling any of the package encapsulant away from the substrate surface, or twisting the substrate or encapsulant so as to damage the packaged electronic device, either cosmetically, mechanically or electrically.

In step 406, structure for making external electrical connection, e.g., connection between the packaged electronic device and another mounting board, is formed on the packaged electronic device. The structure can be, for instance, solder bumps formed on a surface of the substrate, a plurality of leads attached to a surface of the substrate, or a piece of TAB tape attached to a surface of the substrate.

Figure 5A:
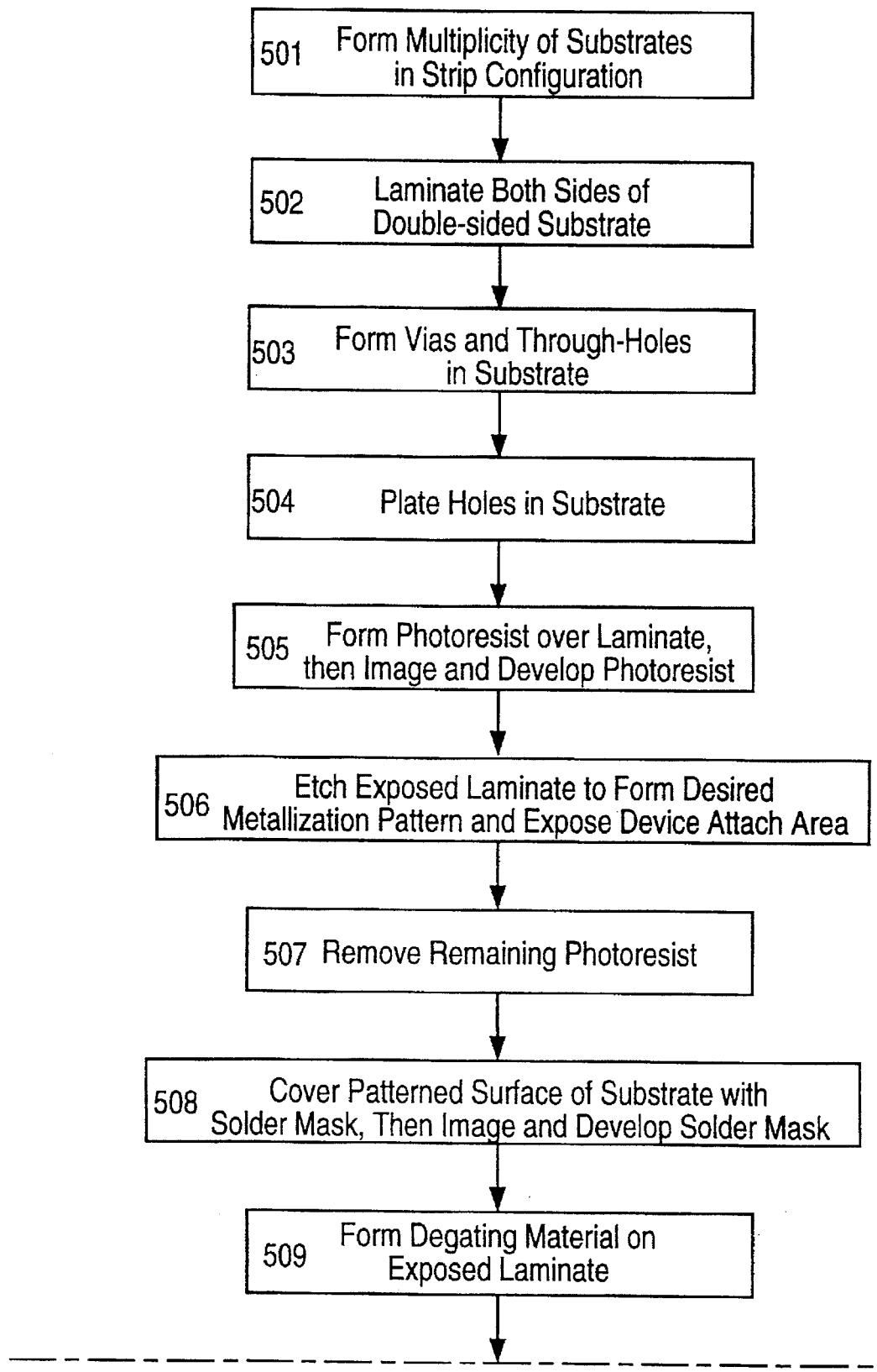
FIG. 5 is a key to FIGS. 5A and 5B which are a block diagram of a process according to another embodiment of the invention for forming a substrate-based packaged electronic device such as a ball grid array.

FIGS. 5A and 5B are a block diagram of a process 500 according to another embodiment of the invention for forming a substrate-based packaged electronic device such as a ball grid array. In step 501, a multiplicity of standard double-sided PCB substrates are formed in a strip configuration. The strip of substrates is made of, for example, epoxy-glass or polyimide-glass. The PCB substrates can be multilayer substrates or single layer substrates. If multilayer substrates are used, electrically conductive traces and/or regions (e.g., ground planes or power planes) can be formed within the multilayer substrates and connected to exterior surfaces of the multilayer substrate with vias or through-holes.

Figure 6A:
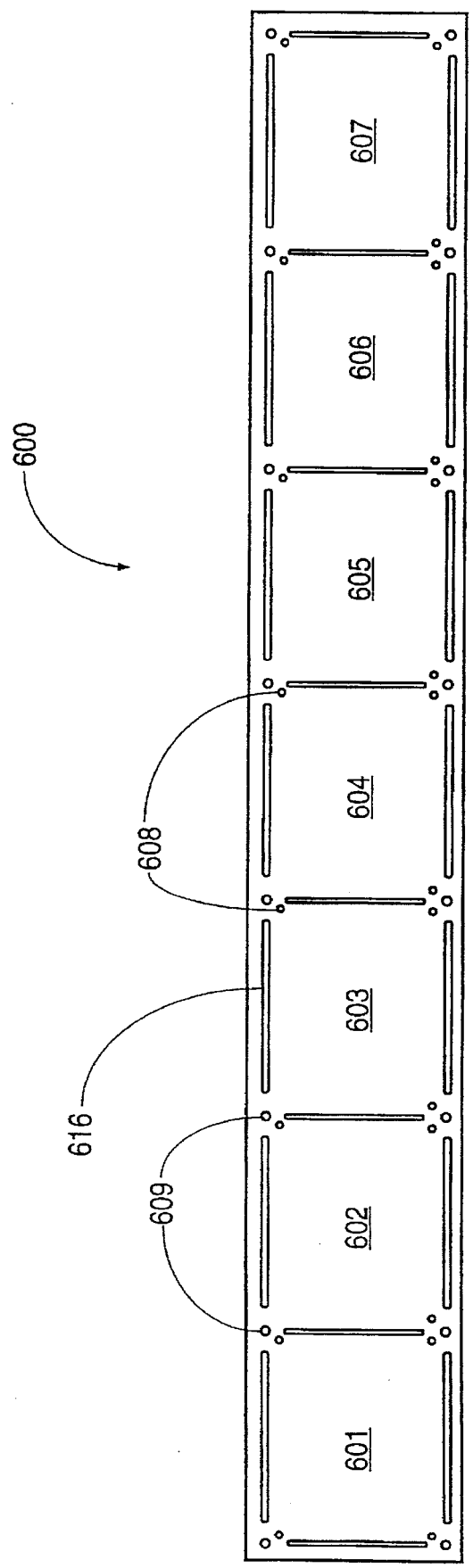
FIG. 6A is a plan view of a multiplicity of substrates formed in a strip according to an embodiment of the invention.

FIG. 6A is a plan view of a multiplicity of substrates 601–607 formed in a strip 600 according to an embodiment of the invention. Though the strip 600 includes seven substrates 601–607, a strip for use with the invention can include any number of substrates that is compatible with the manufacturing equipment, e.g., mold, being used.

The strip 600 includes tooling holes 609 (for simplicity, only two tooling holes are denoted with the numeral 609 in FIG. 6A) formed at intervals along opposite sides of the strip 600. The tooling holes 609 are used to position the strip 600 on the various pieces of manufacturing equipment, e.g., mold, used in the production of a packaged electronic device according to the invention.

The strip 600 also includes punching holes 608 (for simplicity, only two are denoted with the numeral 608 in FIG. 6A) formed at the corners of each of the substrates 601–607. The punching holes 608 help avoid rough edges at the corners of the substrates 601–607 when the substrates 601–607 are separated from the strip 600, as described in more detail below. A punching hole 608 is not formed at one corner of each of the substrates 601–607 where a degating region is formed, as described in more detail below (see FIG. 6B), so that material used to formed the degating region cannot undesirably fill the hole.

The strip 600 further includes slots 616 (for simplicity, only one slot is denoted with the numeral 616 in FIG. 6A) formed at intervals along opposite sides of the strip 600 between the tooling holes 609. The slots 616 provide a stress relief for the strip 600 to help control potential warping of the strip 600.

Hereafter, the process 500 is generally described with respect to a single substrate. It is to be understood that each of the steps described below with respect to a single substrate is applied to each of the substrates 601–607 in the strip 600.

In step 502, an electrically conductive material such as copper is formed on both sides of the substrate by, for instance, lamination using techniques and equipment as are well known in the art. Other methods of forming the electrically conductive material on the substrate surfaces can be used, such as sputtering, electroless plating.

In step 503, vias and through-holes are formed in the substrate. Vias and through-holes can be formed by any of a number of well-known techniques including mechanical drilling or laser drilling.

In step 504, the vias and through-holes are plated with an electrically conductive material, such as copper, using any of a number of well-known techniques, such as electroless plating. When plated, the vias and through-holes enable electrical connection to be made between electrically conductive material—such as traces, ground planes and power planes—formed in or on surfaces of the substrate or within the substrate. For example, vias or through-holes are necessary to make electrical connection between traces that extend from solder pads on one side of the substrate (formed as described below) and traces that are formed on an opposite side of the substrate and electrically connected to an electronic device attached to that side of the substrate (also formed as described below).

In step 505, photoresist is formed over the laminated surfaces of the substrate using conventional techniques and materials, then imaged and developed. As is well-known, a mask is used to image only certain areas of the photoresist which, when developed, are removed to leave portions of the electrically conductive laminate material exposed.

In step 506, the exposed electrically conductive laminate material is etched so that, when the remainder of the photoresist is removed, as explained below, a desired pattern of electrically conductive material is left exposed on the substrate surfaces. The electrically conductive material is etched using an etchant and etch times that are appropriate for that material, as is well-known in the art.

On one surface (device attach surface) of the substrate, electrically conductive material can be exposed in the device attach area if it is desired to electrically bias the backside of the electronic device, as is sometimes done with integrated circuit chips. Electrically conductive material is exposed to form an arrangement of electrically conductive traces around the device attach area. Electrically conductive material is also exposed in the degating region, described in more detail below, to allow electroplating of a degating material to the electrically conductive material in order to form a stronger attachment than would be formed if the degating material were formed directly on the substrate material. Electrically conductive material can also be formed in an annular ring around each of the vias or through-holes, if desired, to help ensure a good electrical connection between each via or through-hole and a corresponding trace on the surface of the substrate.

On an opposite surface of the substrate (mounting surface), electrically conductive material is exposed to form solder pads and associated traces. The solder pads can be formed in any desired shape, e.g., circular, and in any desired pattern, e.g., a rectangular array.

In step 507, the remaining photoresist is removed to expose the desired pattern of electrically conductive material. The photoresist is removed by stripping using solvent strippers and stripping times as are well-known.

In step 508, solder mask, such as liquid photoimagable solder mask or dry film solder mask, is used to cover the patterned surfaces of the substrate, then imaged and developed. The solder mask is applied by, for instance, laminating or screening. A mask is used to image only certain areas of the solder mask which are developed to leave electrically conductive material exposed, e.g., the degating region and the inner ends of the arrangement of electrically conductive traces around the device attach area. Areas at which it is necessary or desirable to form an electrical insulator over the electrically conductive material are left undeveloped, e.g., the outer portions of the arrangement of traces around the device attach area. The remaining solder mask defines the areas to be plated in the next step of the process.

In step 509, a "degating material" is formed on the exposed electrically conductive material. The degating material can be, for example, plated using conventional techniques so that degating material is formed only on the electrically conductive material (which is, typically, metal such as copper). The degating material is, illustratively, 20–40 microinches thick.

Figure 6B:
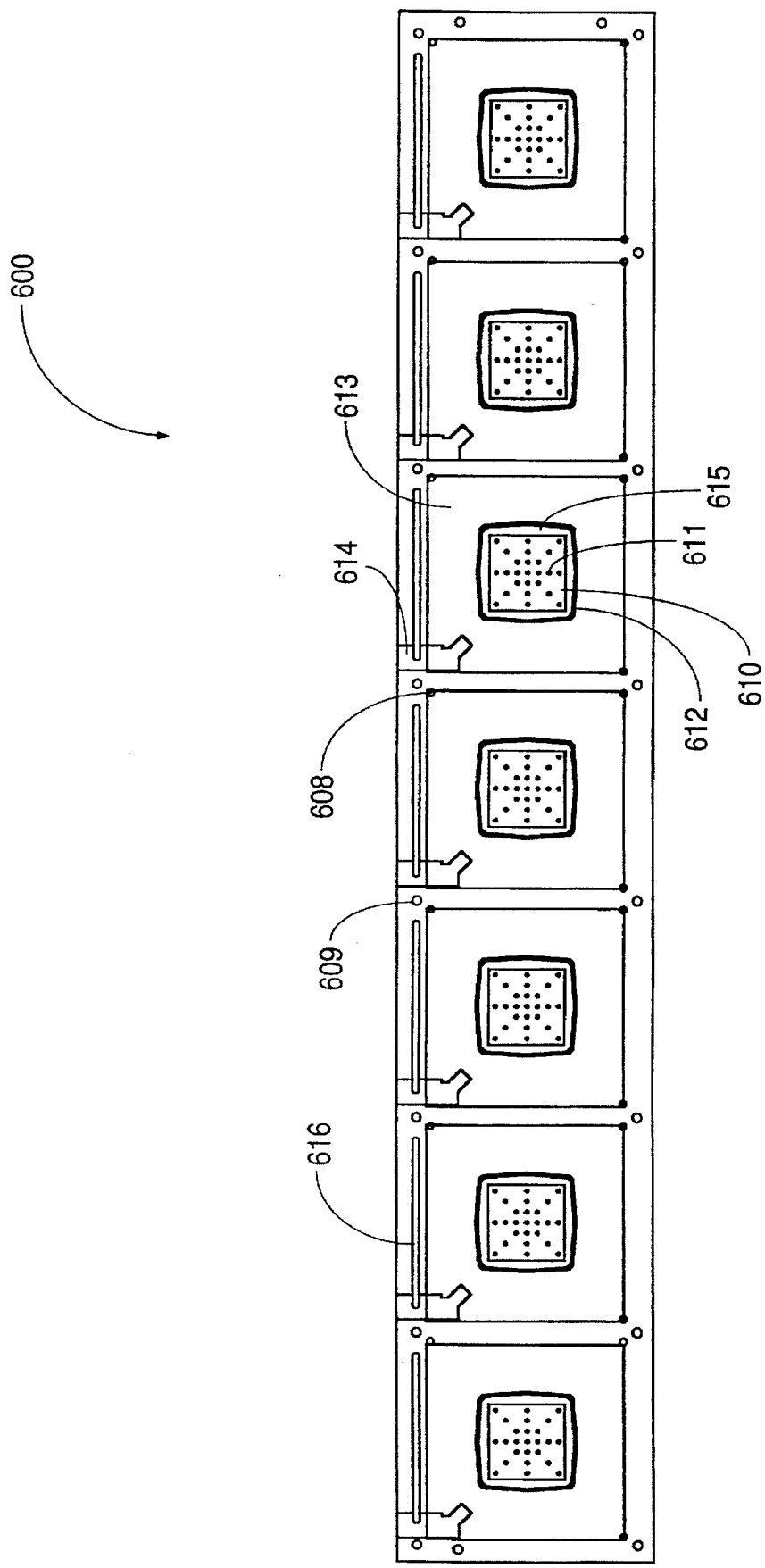
FIG. 6B is a plan view of the strip of FIG. 6A after formation of a degating material on the substrates.
Figure 6C:
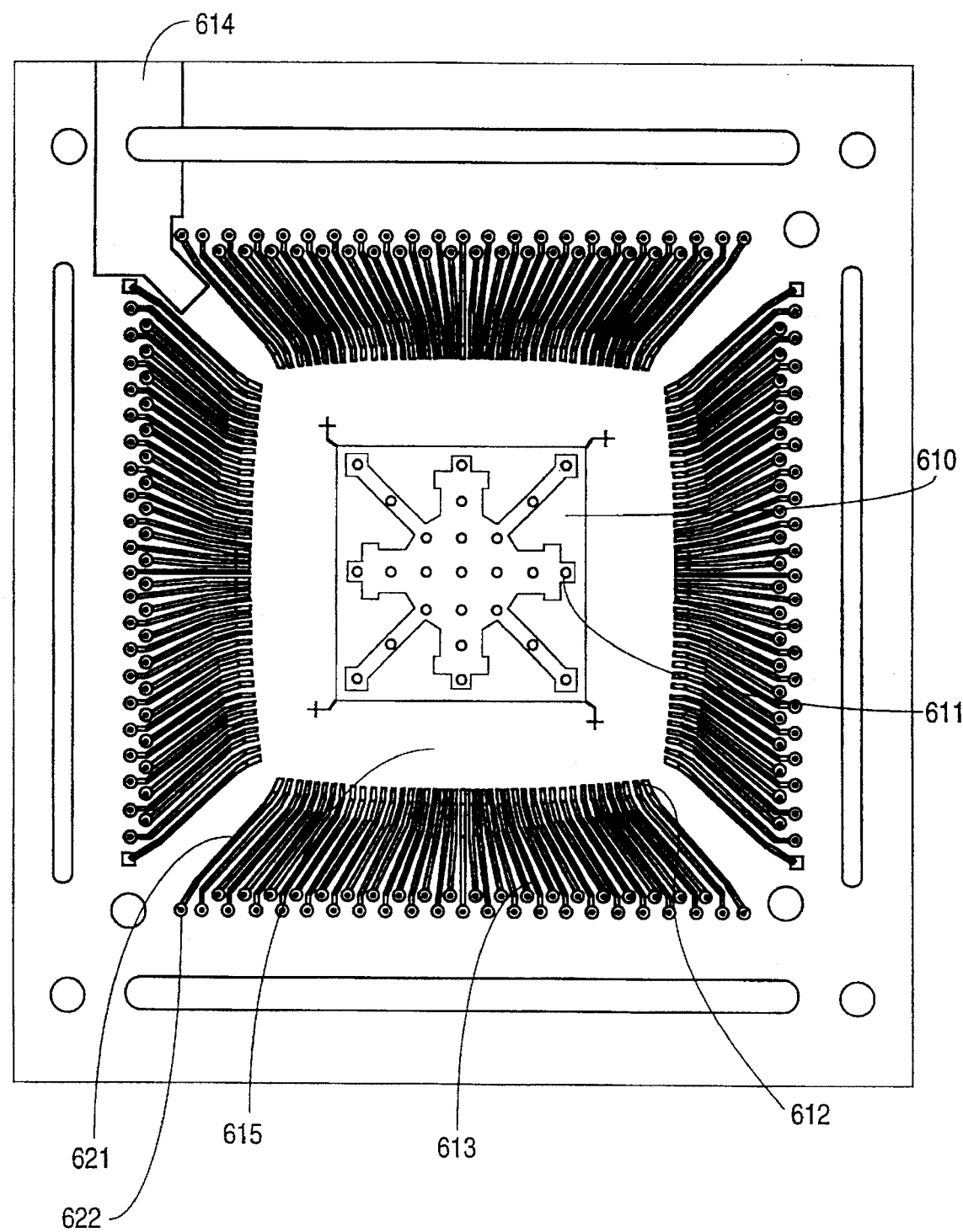
FIG. 6C is a plan view of one of the substrates of FIG. 6B.

FIG. 6B is a plan view of the strip 600 of FIG. 6A after formation of the degating material 614 on the substrates 601–607. FIG. 6C is a plan view of one of the substrates 601–607 of FIG. 6B. (Each of the substrates 601–607 looks as pictured in FIG. 6C.)

In FIG. 6B, solder mask is formed on the device attach area 610 and over the electrically conductive traces (except the inner ends 612, as described below) formed in a region 613. FIG. 6C illustrates in more detail the electrically conductive traces, e.g., trace 621, and associated vias, e.g., via 622. A region 615 is a portion of the substrate that remains exposed through the solder mask.

A plurality of holes 611 are formed through the solder mask on the device attach area 610 to allow electrical connection to electrically conductive material formed underneath the solder mask, thereby enabling biasing of the backside of the electronic device attached to the device attach area 610. The holes 611 can be formed in any desired pattern and have any desired size. In another embodiment of the invention, the holes 611 are not present and the backside of the electronic device is not biased.

Since the inner ends 612 of the arrangement of electrically conductive traces around the device attach area are left exposed, degating material is formed over the inner ends 612. Thus, the degating material must be a material that allows a good bond to be formed with a structure for interconnecting the electronic device (attached to the substrate in a later step of the process) to the traces, e.g., a plurality of bond wires. For simplicity, the inner ends 612 of the traces are shown as a continuous region in FIG. 6B. FIG. 6C shows the individual inner ends 612 of the traces.

Degating material is also formed in the exposed degating region 614. The degating region 614 is an area of the device attach surface over which a mold runner is positioned during encapsulation of the electronic device. As described above, it is necessary that encapsulant that hardens in the mold runner on the degating region 614 be easily separated from the degating region 614. Thus, the degating material must also be a material that adheres poorly with the encapsulant material as compared to the adhesion between the encapsulant material and the substrate material.

Additionally, in embodiments of the invention in which an electrically conductive device attach area is left partially or wholly exposed, the degating material is also formed over the exposed portions of the device attach area. The degating material is also formed on the solder pads on the mounting surface of the substrate to prevent oxidation of the solder pads.

In one embodiment of the invention, the degating material is gold. Gold forms a good bond with gold or aluminum bond wires that can be used to attach the electronic device to the traces on the device attach surface of the substrate. Further, for typical encapsulant and substrate materials, the adhesion force between gold and the encapsulant material is much less than the adhesion force between the substrate material and the encapsulant material.

Table I below presents adhesion data for illustrative encapsulant and substrate materials. The adhesion forces (in kilograms of force, kgf) between the encapsulant and the bare substrate, and between the encapsulant and gold, are given for a variety of combinations of encapsulant and substrate. The encapsulant materials designated as KMC210-9 and X-43-2215 are commercially available from Shin-Etsu of Japan. The substrate materials designated as CCL-HL802 and CCL-HL832 are commercially available from Mitsubishi Gas Chemical of Japan. The substrate material designated as TL-01 is available from Teijin, Limited of Japan. The substrate material designated as R-4785 is commercially available from Matsushita of Japan.

TABLE I

| Substrate, Encapsulant | Gold plating (force in kgf) | Bare substrate (force in kgf) |
|---|---|---|
| CCL-HL802, KMC210-9 | 3.9 | >40 |
| CCL-HL802, X-43-2215 | 3.8 | >40 |
| CCL-HL832, KMC210-9 | 4.0 | >40 |
| CCL-HL832, X-43-2215 | 4.5 | >40 |
| TL-01, KMC210-9 | 3.8 | >40 |
| TL-01, X-43-2215 | 3.5 | >40 |
| R-4785, KMC210-9 | 3.9 | >40 |
| R-4785, X-43-2215 | 4.0 | >40 |

Thus, as is evident from Table I, for typical encapsulant and substrate materials, the adhesion force between gold and the encapsulant is approximately one tenth of the adhesion force between the substrate and the encapsulant.

In another embodiment of the invention, the degating material is palladium. As gold, palladium also bonds well with conventional bond wire material and adheres to typical encapsulant materials much less than does the substrate material.

As discussed above, the adhesive force between the degating material and the encapsulant material is less (and, in some embodiments, much less) than the adhesive force between the substrate material and the encapsulant material. In addition to the degating region and substrate, the encapsulant also contacts the solder mask that is formed on some areas of the substrate surface. Generally, the adhesive force between the encapsulant material and the solder mask material, and between the solder mask material and the substrate material is equal to or greater than the adhesive force between the substrate material and the encapsulant material. Consequently, the comparative data in Table I above apply with even greater force in comparing the adhesive force between the degating material and the encapsulant material to the adhesive force between the solder mask material and the encapsulant material or the substrate material. Generally, then, the bond between the substrate and encapsulant is of greater concern than the bond between the solder mask and the encapsulant or substrate, and the description herein focuses specifically on the comparison between adhesion of the encapsulant material to the degating material and the substrate material. However, it should be noted, and it is within the ambit of the invention, that the adhesive force between the degating material and the encapsulant material be reduced with respect to the adhesive force between the solder mask material and either the substrate material or encapsulant material in the same manner as described herein with respect to the adhesive force between the substrate material and encapsulant material.

In step 510, an electronic device such as an integrated circuit chip is attached to the device attach area of the substrate. The electronic device is attached with a conventional adhesive using conventional processes and equipment. The adhesive can be electrically conductive, e.g., silver filled epoxy, if it is desired to bias the body of the electronic device by electrically connecting the body to exposed electrically conductive material formed in the device attach area. Alternatively, the electronic device can be eutectically bonded to the substrate.

The electronic device is electrically connected to electrically conductive material formed in or on the surface of the substrate, such as the arrangement of electrically conductive traces around the device attach area mentioned above, by, for example, wirebonding, flip chip connection (C4) or TAB. Conventional equipment and processes can be used to make the electrical connection. In one embodiment of the invention in which the degating material is gold, electrical connection between the electronic device and the substrate is made with gold or aluminum bond wire.

Figure 1:
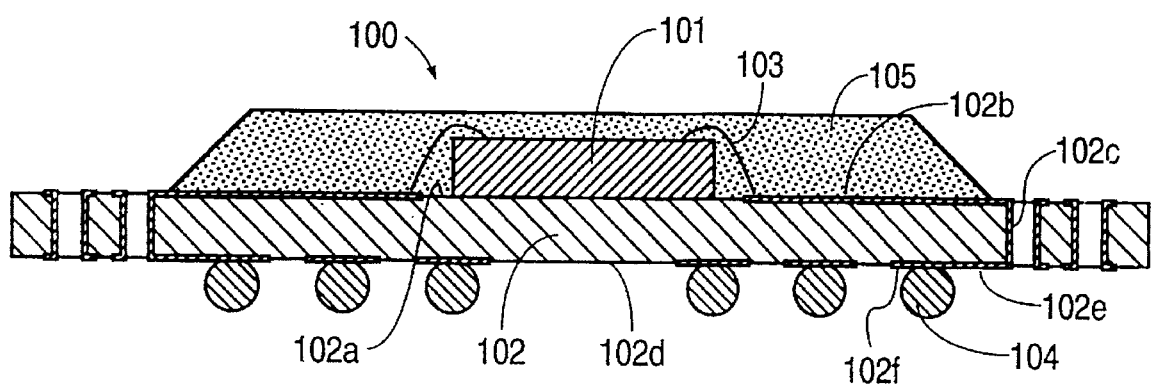
FIG. 1 is a cross-sectional view of a typical ball grid array.
Figure 2A:
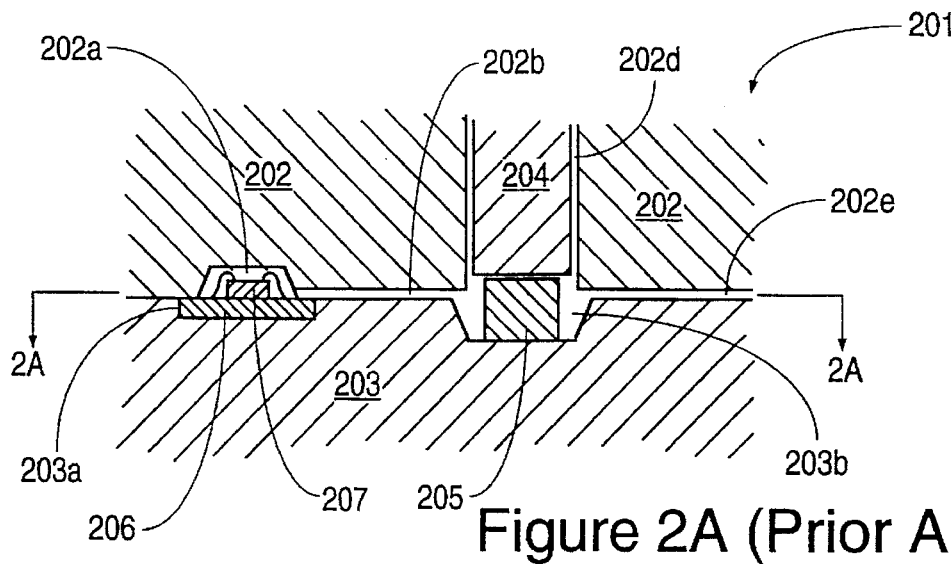
FIGS. 2A and 2B are cross-sectional views of a conventional two-piece mold.
Figure 2B:
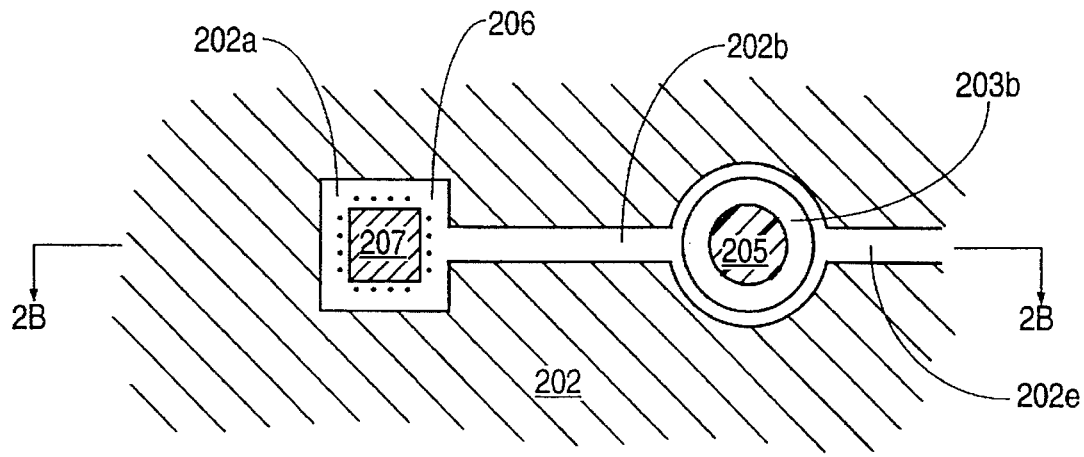
Figure 3:
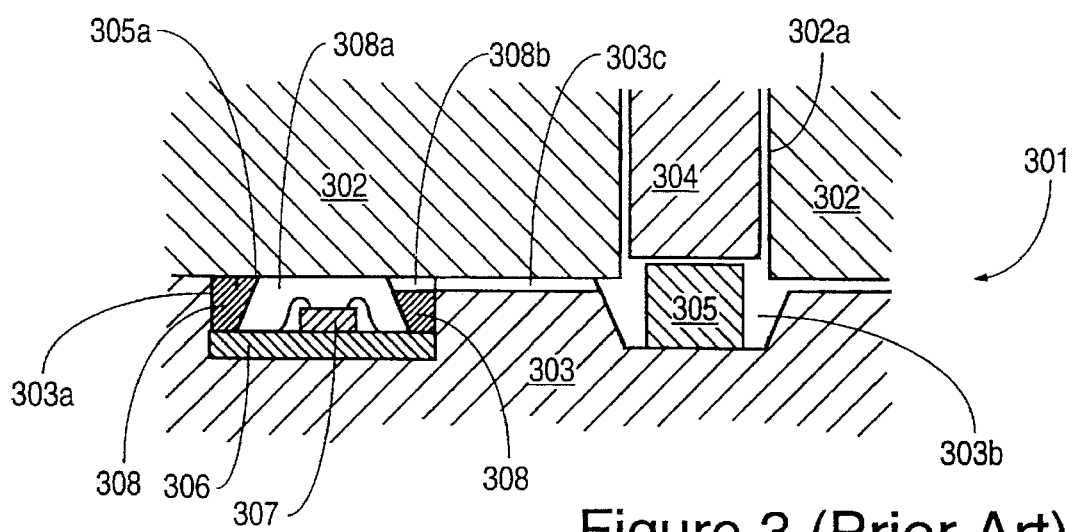
FIG. 3 is a cross-sectional view of one type of three-piece mold.
Figure 7A:
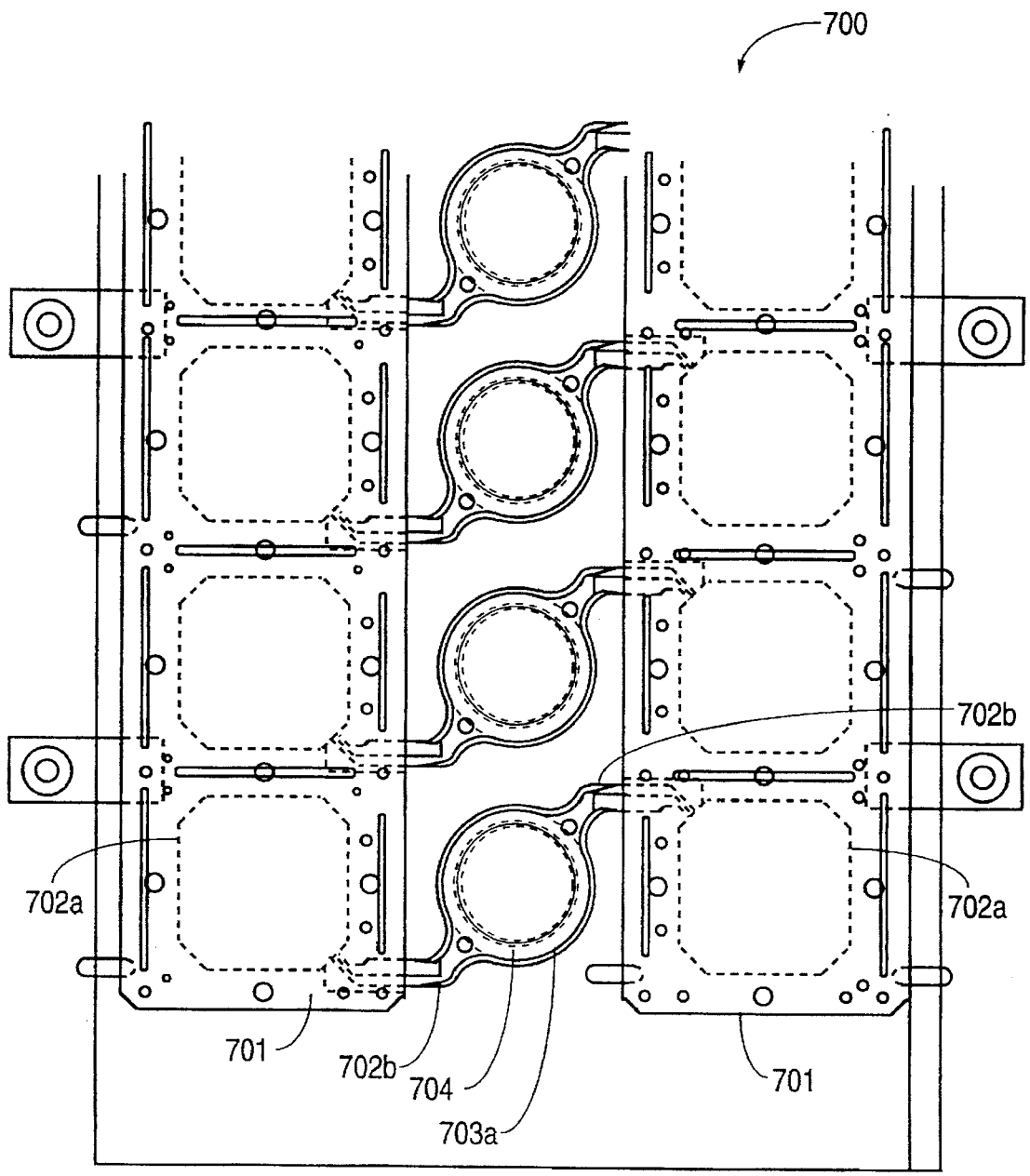
FIGS. 7A and 7B are a plan view and cross-sectional view, respectively, of a two-piece automatic mold for use in producing a substrate-based packaged electronic device according to the invention.
Figure 7B:
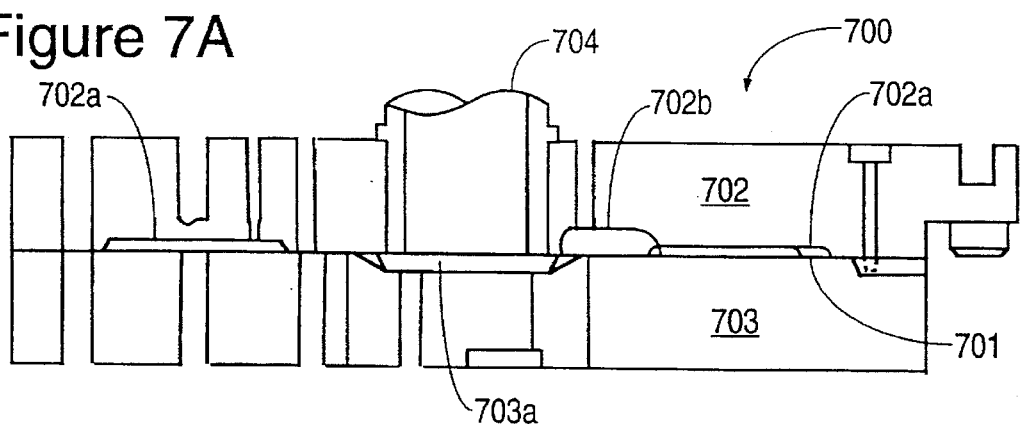

In step 511, the strip of substrates is placed in a mold for encapsulating the electronic devices formed on the substrates. FIGS. 7A and 7B are a plan view and cross-sectional view, respectively, of a two-piece automatic mold 700 for use in producing substrate-based packaged electronic devices according to the invention. The mold 700 is similar to the mold 201 (FIGS. 2A and 2B) described above. Generally, encapsulation of the electronic device in a substrate-based packaged electronic device according to the invention can be done using any conventional two-piece mold.

As seen in FIG. 7B, the mold 700 includes a first mold section 702 (upper mold section) and a second mold section 703 (lower mold section). A strip 701 of substrates is positioned between the upper mold section 702 and the lower mold section 703 on either side of a plurality of pots 703a formed in the lower mold section 703. A plurality of mold cavities 702a are formed on opposing sides of each pot 703a. A die (not shown) is attached to each substrate in the substrate strip 701 such that the die is positioned in a corresponding one of the mold cavities 702a. A mold runner 702b extends from each pot 703a to each of a corresponding pair of the mold cavities 702a.

In step 512 (FIGS. 5A and 5B), encapsulant (not shown) is transferred from each of the pots 703a (FIGS. 7A and 7B) to corresponding mold cavities 702a by lowering a transfer ram 704 into each pot 703a to force encapsulant (not shown) from the pot 703a into the mold cavities 702a. After the mold cavities 702a are filled, the encapsulant is cured to harden according to a time/temperature profile that is appropriate for the encapsulant being used. Instead of transfer molding, the encapsulant can be formed by injection molding or reaction injection molding. The encapsulant is generally either a thermoplastic (typically used in transfer molding) or thermoset (typically used in injection molding) compound. Illustratively, one of the compounds in Table I above are used.

Figure 8A:
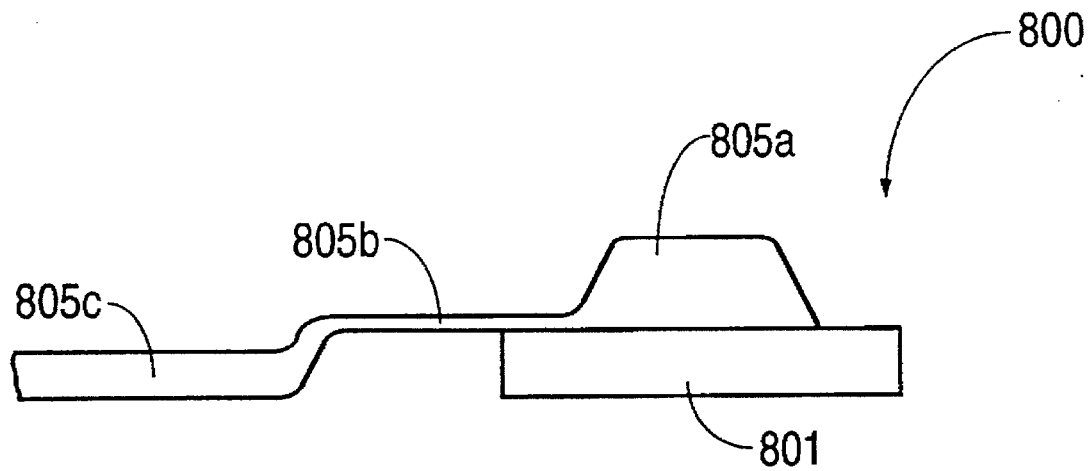
FIG. 8A is a side view of a packaged electronic device according to the invention immediately after hardening of the encapsulant.

FIG. 8A is a side view of a packaged electronic device 800 according to the invention immediately after hardening of the encapsulant. For clarity in the explanation of FIG. 8A, and FIG. 8B below, the mold 700 is not shown.

After the encapsulant hardens, the encapsulant (package encapsulant) 805a within the mold cavity 702a (FIGS. 7A and 7B) is formed over the electronic device, as desired. However, the encapsulant (excess encapsulant) 805b is also formed on the substrate surface where the mold runner 702b was positioned, and extends from the package encapsulant 805a to the encapsulant 805c within the pot. The excess encapsulant 805b must be removed before the packaged electronic device 800 is complete.

Figure 8B:
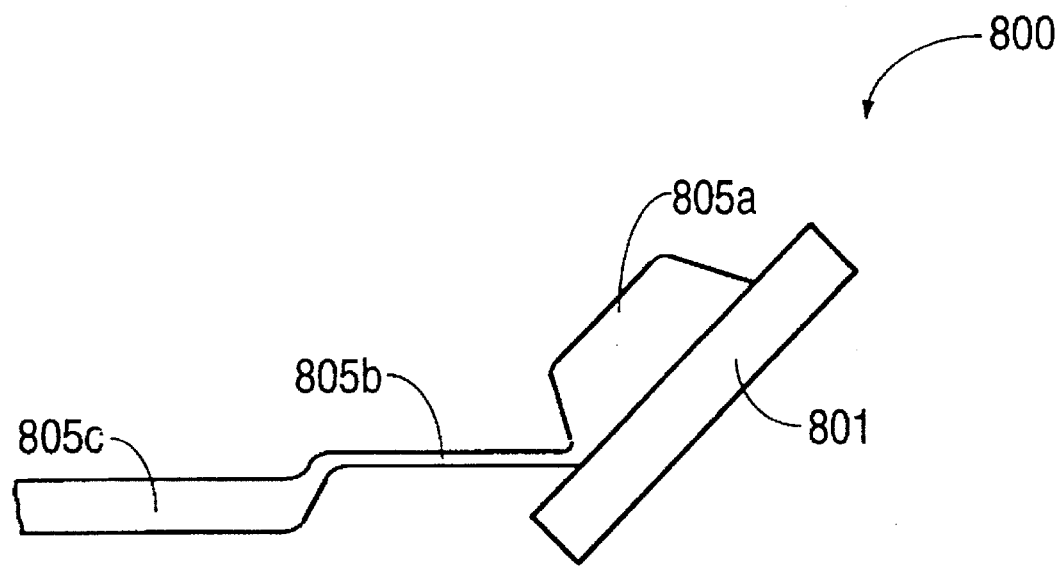
FIG. 8B is a side view of a packaged electronic device according to the invention illustrating the removal of excess encapsulant.

In step 513 (FIGS. 5A and 5B), the excess encapsulant 805b is removed from the packaged electronic device 800 in a process known as "degating." FIG. 8B is a side view of the packaged electronic device 800 illustrating degating of the excess encapsulant 805b. Degating is performed at a degating station using conventional equipment and techniques. In degating, the substrate 801 is tilted with respect to the excess encapsulant 805b as shown in FIG. 8B. Since, as explained in more detail above and below, the excess encapsulant 805b does not adhere strongly to the degating region, as the substrate 801 is tilted, the excess encapsulant 805b peels away from the degating region. Eventually, since the cross-section of the excess encapsulant 805b is small at the interface between the excess encapsulant 805b and the package encapsulant 805a, the excess encapsulant 805b is snapped off at the interface, leaving only the package encapsulant 805a on the packaged electronic device 800. Degating, as described above, can be automated as part of the encapsulation process in an automold system, or can be done as a separate and distinct process step if a manual two-piece mold is used.

Figure 9:
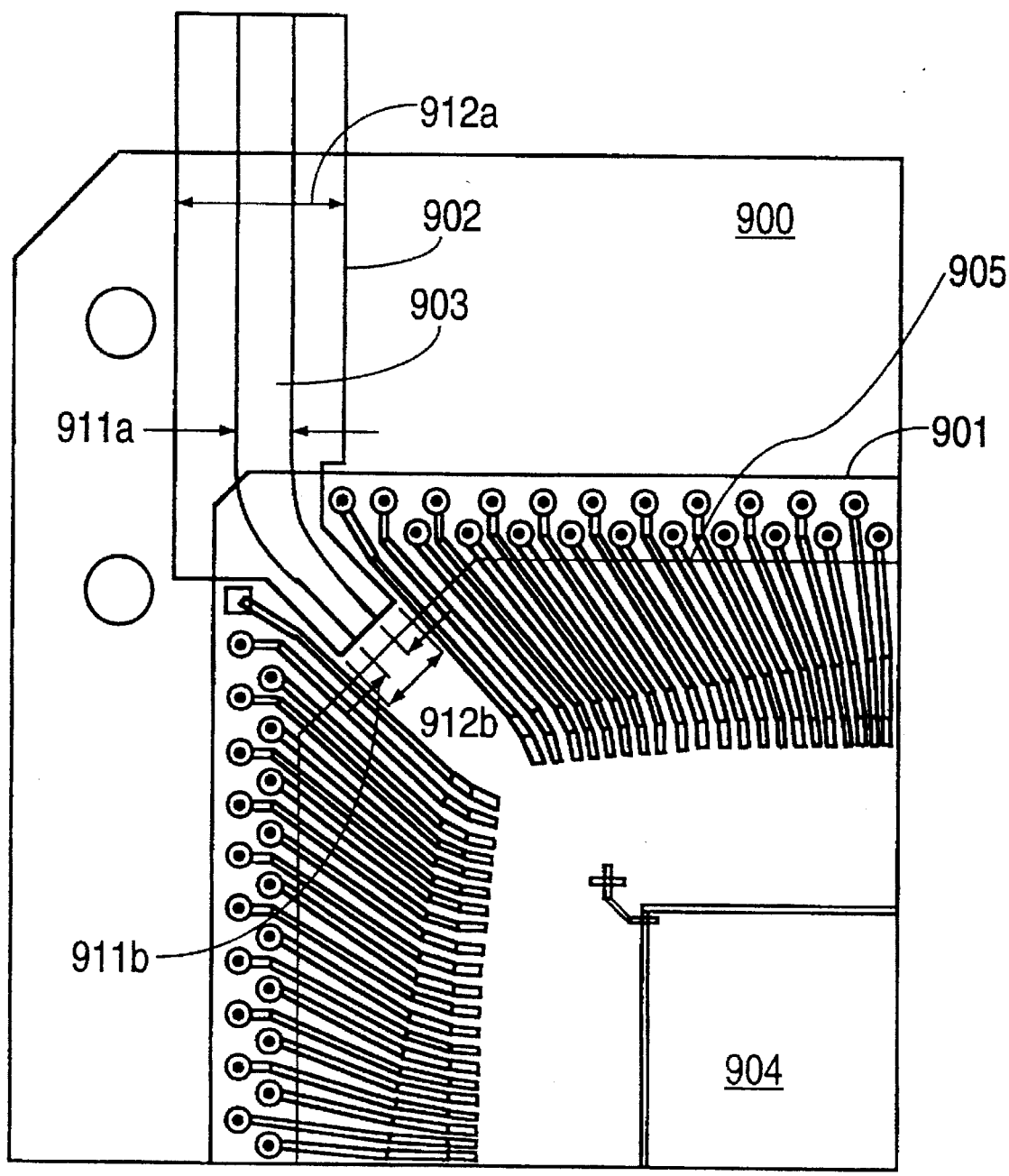
FIG. 9 is a detailed plan view of a portion of a substrate strip according to the invention illustrating the placement of a mold runner with respect to a degating region formed on the substrate strip.
Figure 6B:
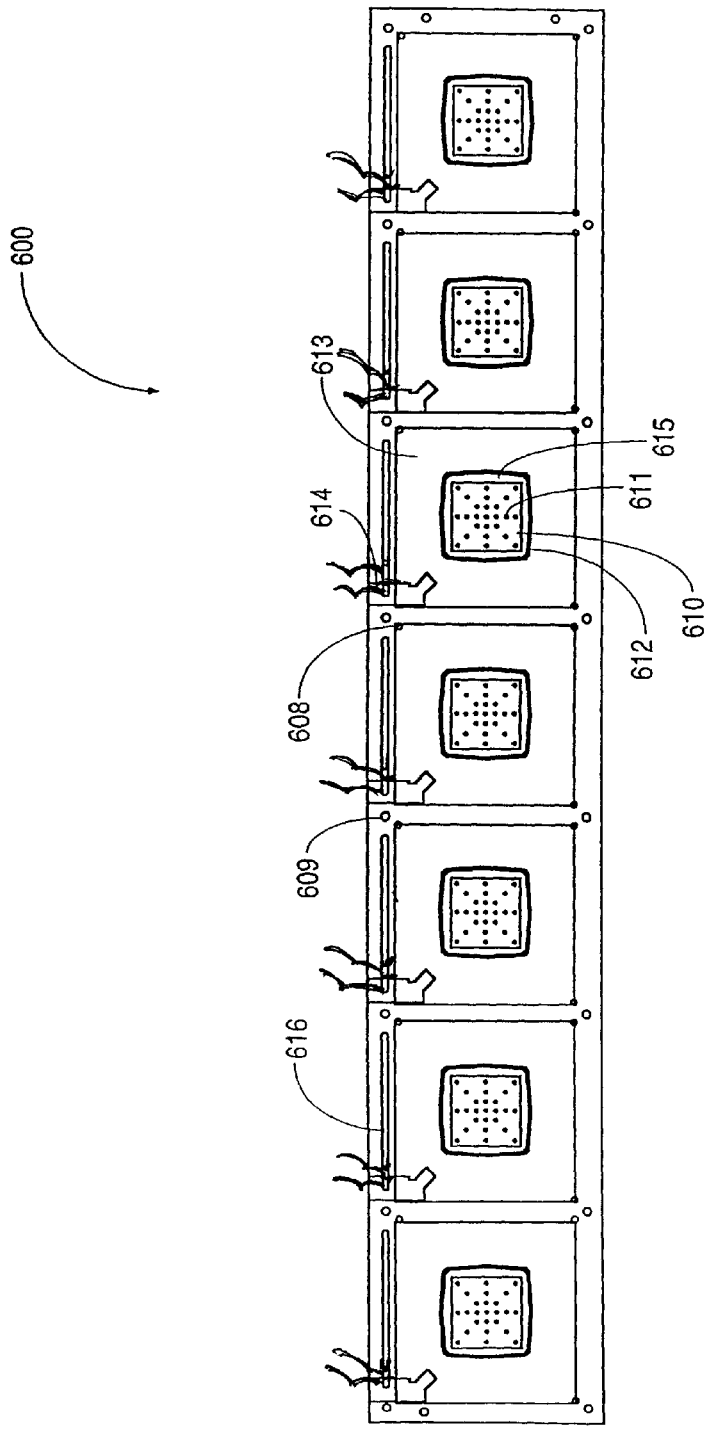

FIG. 9 is a detailed plan view of a portion of a substrate strip 900 according to the invention illustrating the placement of a mold runner 903 with respect to a degating region 902 formed on the substrate strip 900. FIG. 9 also illustrates the outline of a substrate 901, a device attach surface 904 and a package encapsulant 905 that encloses the electronic device (not shown).

The degating region 902 extends from off of the substrate 901 to the edge of the package encapsulant 905. In one embodiment, the degating region 902 has a width 912a of 3.4 mm off of the substrate 901 and a width 912b of 1.5 mm near the edge of the package encapsulant 905. The mold runner 903 is approximately centrally positioned within the outline of the degating region 902. In one embodiment, the mold runner 903 has a width 911a of 2.0 mm above the portion of the degating region 902 off of the substrate 901, and gradually necks down to a width 911b of 1.25 mm adjacent the edge of the package encapsulant 905. Generally, it is only necessary that the width of the mold runner 903 be smaller than the width of the degating region 902. The height (perpendicular to the plane of FIG. 9) of the mold runner 903 also necks down from a first height above the portion of the degating region 902 off of the substrate 901 to a second height, less than the first height, adjacent the edge of the package encapsulant 905. The exact dimensions associated with the necking down of the mold runner 903 are established according to principles well known in the art of molding.

Since the edges of the mold runner 903 are entirely within the area of the degating region 902, the excess encapsulant formed within the mold runner 903 contacts only the degating region 902. Since the degating region material adheres poorly to the encapsulant material, the excess encapsulant peels away from the degating region 902 easily without damaging the surface of the substrate 901 or adhering to the substrate 901 so as to cause the substrate strip 900 to twist or otherwise deform. The small cross-section of the mold runner 903 adjacent the edge of the package encapsulant 905 enables the excess encapsulant to be readily broken off from the package encapsulant 905.

In step 514, solder bumps are formed on the solder pads on the mounting surface of the substrate by coating with solder plating, reflowing with solder paste or solder spheres, or other appropriate method. Illustratively, the solder bumps are made of a tin-lead alloy. Each of the solder bumps is electrically connected to the electronic device, e.g., a bond pad on an integrated circuit chip, through a trace formed on the mounting surface, a via formed through the substrate (or a combination of vias and trace(s) formed within the substrate), a trace formed on the device attach surface and, illustratively, a bond wire. After formation of the solder bumps, a multiplicity of packaged electronic devices have been formed and are connected together in a strip.

Alternatively, rather than forming solder bumps, a leadframe or a TAB tape leads could be attached to the mounting surface of each substrate to provide a structure for making external electrical connection from the packaged electronic device. In this case, the leads of the leadframe or TAB tape could be attached directly to the vias or through-holes formed in the substrate, or the leads could be attached to electrically conductive traces extending from the vias or through-holes toward the edge of the substrate.

In step 515, the strip of packaged electronic devices is removed from the mold and the packaged electronic devices are separated from each other, resulting in a multiplicity of completed ball grid arrays. The packaged electronic devices are separated by, for example, punching, sawing or snapping. Punching holes (e.g., punching holes 608 of FIG. 6A) may be formed in the strip to aid in the separation of the substrates from the strip. Additionally, the strip can be scored to define each substrate and the substrates separated from the strip along the scoring line.

In the above description, a single electronic device is attached to a surface of the substrate. Typically, the electronic device is an integrated circuit chip; however, the electronic device can be another type of active component such as a transistor or diode, or a passive component such as a resistor, capacitor or inductor. Further, more than one electronic device can be attached to a substrate surface. The multiple electronic devices are all enclosed within the package encapsulant.

According to the invention, as illustrated in the embodiments described above, a substrate-based packaged electronic device can be formed using conventional equipment for attachment of the electronic device to the substrate, electrical connection of the electronic device to the substrate, and molding of encapsulant to enclose the electronic device. Further, a plurality of packaged electronic devices according to the invention can be manufactured at one time in a strip configuration. Consequently, packaged electronic devices according to the invention can be produced quickly and at low cost.

In particular, a degating region that allows easy removal of excess encapsulant is provided without introducing additional steps into the process for forming a substrate-based packaged electronic device. This is because the degating material is the same material and is applied at the same time as material used to plate other electrically conductive material on the substrate. Thus, the invention provides good degating at no additional cost.

The presence of the degating region eliminates the necessity of using a three-piece or modified two-piece mold to achieve top gating in order to degate without damaging the packaged electronic device. Consequently, the problems associated with three-piece and modified two-piece molds are avoided. The large amount of existing two-piece mold equipment can be used, thus reducing production costs. Either conventional or automatic two-piece molds can be used.

Various embodiments of the invention have been described. The descriptions are intended to be illustrative, not limitative. Thus, it will be apparent to one skilled in the art that certain modifications may be made to the invention as described without departing from the scope of the claims set out below.

We claim:

1. A substrate-based packaged electronic device, comprising:

a substrate having first and second surfaces;

a degating region on the first surface of the substrate;

a degating region material on the degating region;

a structure for making external electrical connection from the substrate-based packaged electronic device on the second surface of the substrate;

an electronic device attached to the first surface of the substrate, the electronic device being electrically connected to the structure for making external electrical connection; and package encapsulant including an encapsulant material formed on the first surface of the substrate to enclose the electronic device, the degating region being formed outside the package encapsulant, wherein:

the encapsulant material and the degating region material are chosen such that the adhesive force between the encapsulant material and the degating region material is less than the adhesive force between the encapsulant material and the substrate.

2. A substrate-based packaged electronic device as in claim 1, wherein the adhesive force between the encapsulant material and the degating region material is less than one half the adhesive force between the encapsulant material and the substrate.

3. A substrate-based packaged electronic device as in claim 1, wherein the adhesive force between the encapsulant material and the degating region material is approximately 10% of the adhesive force between the encapsulant material and the substrate.

4. A substrate-based packaged electronic device as in claim 1, wherein the degating region material is gold.

5. A substrate-based packaged electronic device as in claim 4, wherein the encapsulant material is a thermosetting epoxy resin.

6. A substrate-based packaged electronic device as in claim 1, wherein the structure for making external electrical connection further comprises a plurality of solder bumps formed on the second surface of the substrate.

7. A substrate-based packaged electronic device as in claim 1, wherein the electronic device is an integrated circuit chip.

8. A substrate-based packaged electronic device as in claim 7, wherein the adhesive force between the encapsulant material and the degating region material is approximately 10% of the adhesive force between the encapsulant material and the substrate.

9. A substrate-based packaged electronic device as in claim 7, wherein the degating region material is gold.

10. A substrate-based packaged electronic device as in claim 1, wherein the substrate is a multilayer substrate, electrically conductive traces and/or regions being formed within the multilayer substrate.

11. A substrate-based packaged electronic device as in claim 1 further comprising excessive encapsulant including the encapsulant material formed on the degating region.

12. A substrate-based packaged electronic device as in claim 1, wherein the degating region material is palladium.

13. A substrate-based packaged electronic device as in claim 1, wherein the degating region extends to an edge of the package encapsulant.

14. A substrate for use in forming a substrate-based packaged electronic device, wherein:

a surface of the substrate is adapted for mounting an electronic device;

further comprising:

a degating region on the surface of the substrate at a location such that the edges of a mold runner of a mold used to encapsulate the electronic device in encapsulant material fit entirely within the degating region when the substrate is positioned in the mold during encapsulation of the electronic device; and a degating region material on the degating region, the degating region material being chosen such that the adhesive force between the encapsulant material and the degating region material is less than the adhesive force between the encapsulant material and the substrate.

15. A substrate as in claim 11, wherein the adhesive force between the encapsulant material and the degating region material is approximately 10% of the adhesive force between the encapsulant material and the substrate.

16. A substrate as in claim 11 wherein the substrate is one of a plurality of substrates formed in a strip configuration for use in forming a plurality of substrate-based packaged electronic devices.

17. A substrate as in claim 13, wherein the adhesive force between the encapsulant material and the degating region material is approximately 10% of the adhesive force between the encapsulant material and the substrate.

* * * * *

UNITED STATES PATENT AND TRADEMARK OFFICE
CERTIFICATE OF CORRECTION

PATENT NO.   : 5,635,671
DATED        : June 3, 1997
INVENTOR(S)  : Bruce J. Freyman, John Briar, Young W. Heo and Il K. Shim It is certified that error appears in the above-identified patent and that said Letters Patent is hereby corrected as shown below:

Drawings,
Delete drawings sheets 7/11 and 8/11, and substitute therefor the drawings sheets, consisting of Figures 6B and 6C, as shown on the attached pages.

Signed and Sealed this

Tenth Day of September, 2002

Attest:

Attesting Officer

JAMES E. ROGAN
Director of the United States Patent and Trademark Office

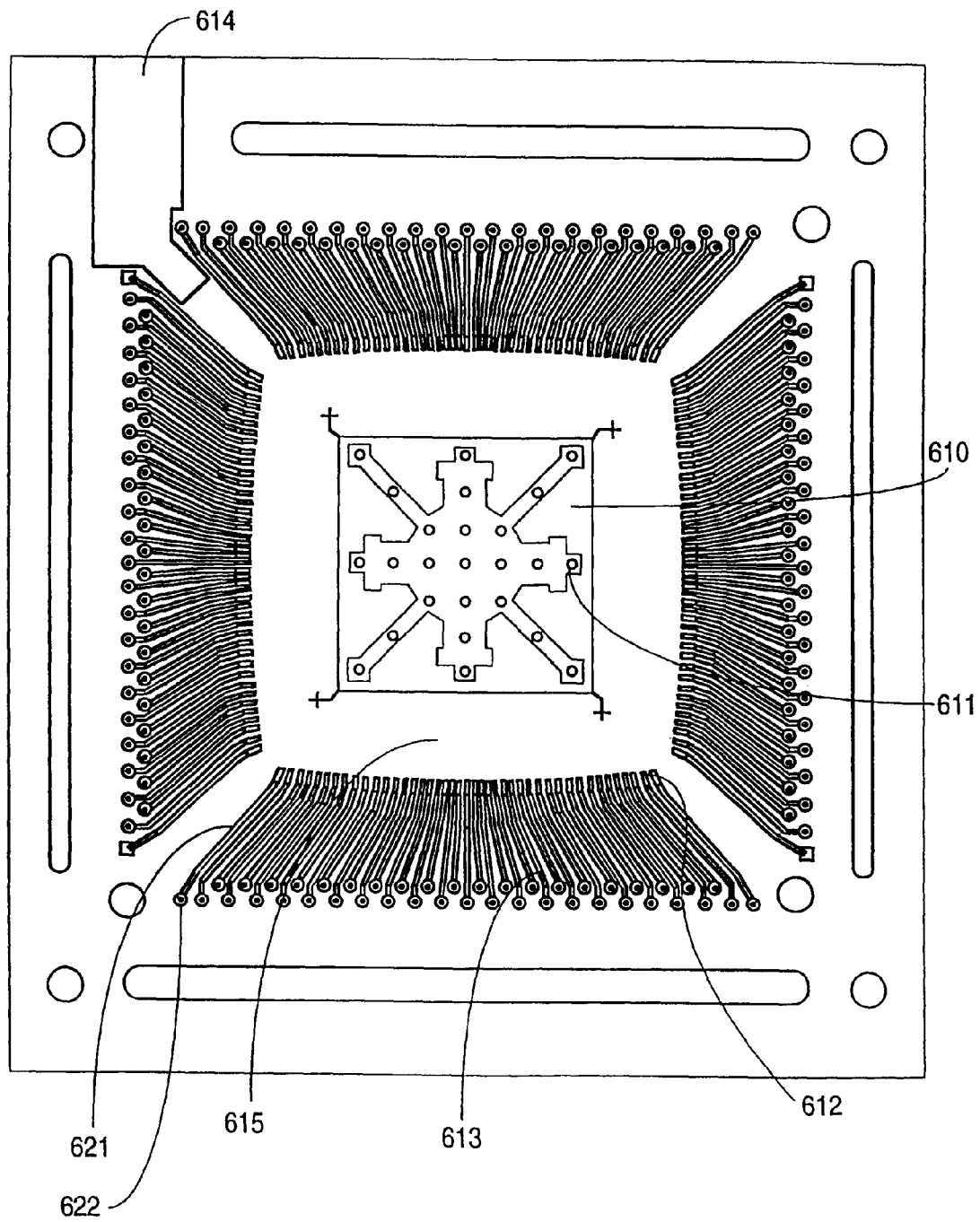

UNITED STATES PATENT AND TRADEMARK OFFICE
CERTIFICATE OF CORRECTION

PATENT NO. : 5,635,671 C1  
APPLICATION NO. : 08/214339  
DATED : May 16, 2006  
INVENTOR(S) : Bruce J. Freyman et al.

Page 1 of 1

It is certified that error appears in the above-identified patent and that said Letters Patent is hereby corrected as shown below:

On the Title page of the Ex Parte Reexamination Certificate, in the Assignee information: change "Amkor Technology Korea, Inc., Seoul (KR)" to --Amkor Technology, Inc., Chandler, AZ (US)--.

Signed and Sealed this

Fourth Day of March, 2008

JON W. DUDAS  
*Director of the United States Patent and Trademark Office*

UNITED STATES PATENT AND TRADEMARK OFFICE
CERTIFICATE OF CORRECTION

PATENT NO. : 5,635,671 C1  
APPLICATION NO. : 90/006461  
DATED : May 16, 2006  
INVENTOR(S) : Bruce J. Freyman et al.

Page 1 of 1

It is certified that error appears in the above-identified patent and that said Letters Patent is hereby corrected as shown below:

On the Title page of the Ex Parte Reexamination Certificate, in the Assignee information: change "Amkor Technology Korea, Inc., Seoul (KR)" to --Amkor Technology, Inc., Chandler, AZ (US)--.

This certificate supersedes the Certificate of Correction issued March 4, 2008.

Signed and Sealed this

Third Day of June, 2008

JON W. DUDAS  
*Director of the United States Patent and Trademark Office*

(12) EX PARTE REEXAMINATION CERTIFICATE (5372nd)
United States Patent
Freyman et al.

(10) Number: US 5,635,671 C1
(45) Certificate Issued: May 16, 2006

(54) MOLD RUNNER REMOVAL FROM A SUBSTRATE-BASED PACKAGED ELECTRONIC DEVICE

(75) Inventors: Bruce J. Freyman, Tempe, AZ (US); John Briar, Phoenix, AZ (US); Young W. Heo, Seongnam (KR); Il K. Shim, Seoul (KR)

(73) Assignee: Amkor Technology Korea, Inc., Seoul (KR)

Reexamination Request:
No. 90/006,461, Nov. 25, 2002

Reexamination Certificate for:
Patent No.: 5,635,671
Issued: Jun. 3, 1997
Appl. No.: 08/214,339
Filed: Mar. 16, 1994

Certificate of Correction issued Sep. 10, 2002.

(51) Int. Cl.
*H01L 23/28* (2006.01)

(52) U.S. Cl. .................. 174/52.2; 257/787; 257/788; 174/52.4; 361/760
(58) Field of Classification Search ............... 174/52.1, 174/52.4, 52.2; 257/748, 749, 760, 761, 762; 29/827, 841
See application file for complete search history.

(56) References Cited

U.S. PATENT DOCUMENTS 4,741,507 A    5/1988  Baird
5,071,612 A   12/1991  Obara
5,355,283 A  * 10/1994  Marrs et al. ................. 361/760
5,478,517 A  * 12/1995  Erdos .......................... 264/161

FOREIGN PATENT DOCUMENTS

| JP | 61-269351 | 11/1986 |
| JP | 4-177753 | 6/1992 |
| JP | 5-13620 | 1/1993 |

* cited by examiner

*Primary Examiner*—Hung V. Ngo

(57) ABSTRACT

According to the invention, an electronic device mounted on a substrate is encapsulated using a standard two-piece mold. A novel degating region is formed on a surface of the substrate to allow removal of excess encapsulant formed on the surface during molding without damaging the remainder of the device. The material of the degating region that contacts the encapsulant forms a weak bond with the encapsulant, relative to the bond formed between the encapsulant and the substrate, so that the encapsulant can be peeled away from the degating region without damaging the substrate or other portion of the device. The degating region is provided without introducing additional steps into the process for forming the device. The presence of the degating region eliminates the necessity of using a three-piece or modified two-piece mold to achieve top gating in order to degate without damaging the device. In one embodiment, the degating region is made of gold. Gold has an adhesive force with typical encapsulant materials that is approximately 10% of the adhesive force between the typical encapsulant materials and typical substrate materials.

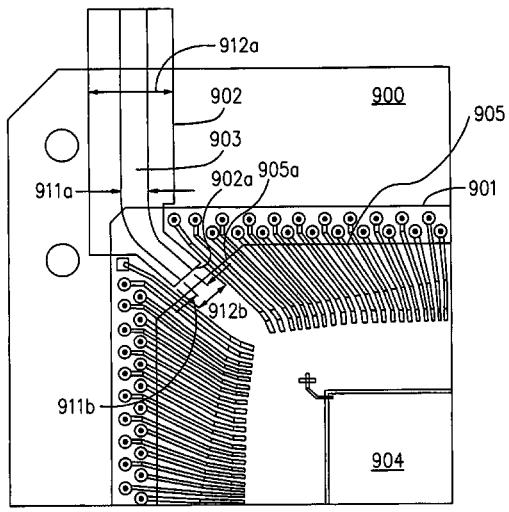

(Amended)

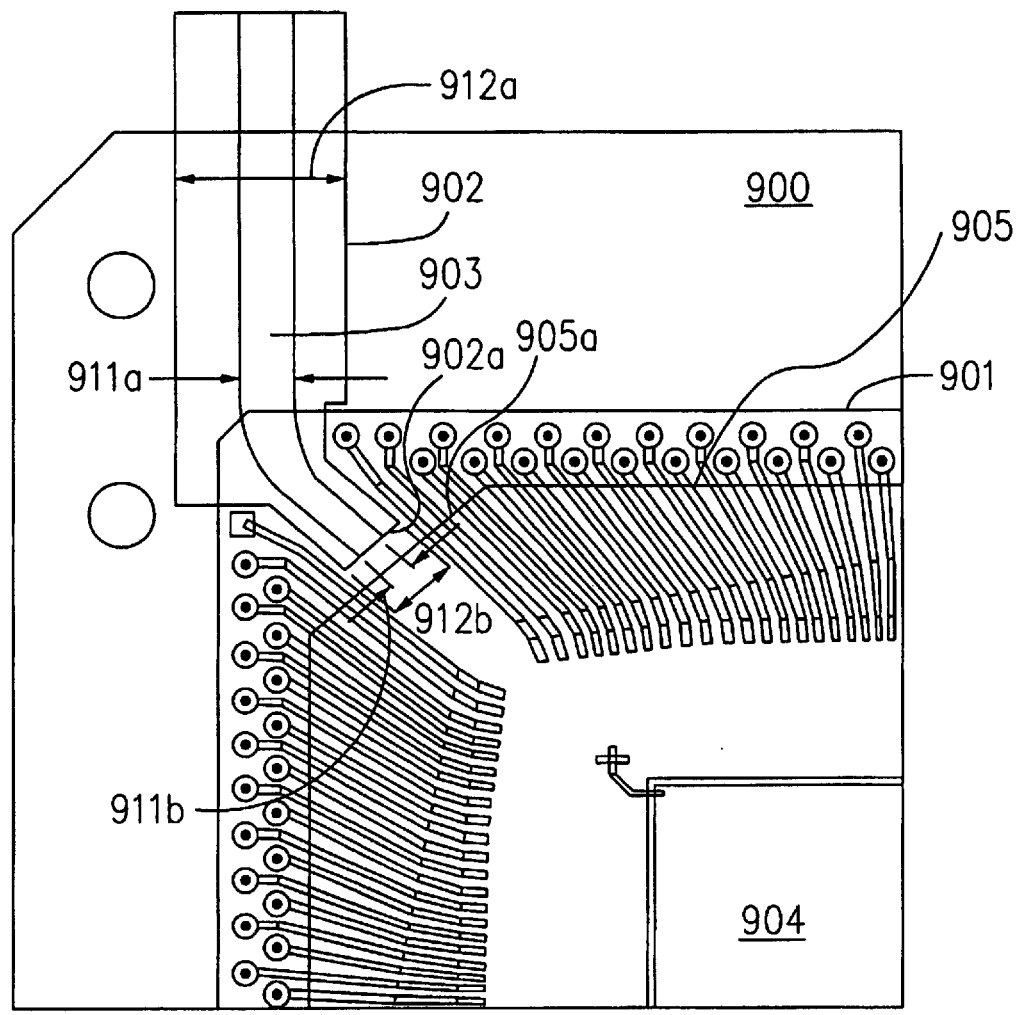
Figure 9
(Amended)

US $5635671$ C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 11, line 60 to column 12, line 13:

The degating region 902 extends from off of the substrate 901 to the edge of the package encapsulant 905. In one embodiment, the degating region 902 has a width 912a of 3.4 mm off of the substrate 901 and a width 912b of 1.5 mm near the edge of the package encapsulant 905. *An edge 902a at the inner end of the degating region 902 faces, but is spaced from, a plane of a sidewall 905a of the encapsulant 905.* The mold runner 903 is approximately centrally positioned within the outline of the degating region 902. In one embodiment, the mold runner 903 has a width 911a of 2.0 mm above the portion of the degating region 902 off of the substrate 901, and gradually necks down to a width 911b of 1.25 mm adjacent the edge of the package encapsulant 905. Generally, it is only necessary that the width of the mold runner 903 be smaller than the width of the degating region 902. The height (perpendicular to the plane of FIG. 9) of the mold runner 903 also necks down from a first height above the portion of the degating region 902 off of the substrate 901 to a second height, less than the first height, adjacent the edge of the package encapsulant 905. The exact dimensions associated with the necking down of the mold runner 903 are established according to principles well known in the art of molding.

THE DRAWING FIGURES HAVE BEEN CHANGED AS FOLLOWS:

Reference numerals 902a and 905a have been added to FIG. 9.

AS A RESULT OF REEXAMINATION, IT HAS BEEN DETERMINED THAT:

Claims 1 and 14 are determined to be patentable as amended.

Claims 2–13, 15, 16 and 17, dependent on an amended claim, are determined to be patentable.

New claims 18 and 19 are added and determined to be patentable.

1. A substrate-based packaged electronic device, comprising:
   a substrate having first and second surfaces;
   a degating region on the first surface of the substrate;
   a degating region material on the degating region;
   a structure for making external electrical connection from the substrate-based packaged electronic device on the second surface of the substrate;
   an electronic device attached to the first surface of the substrate, the electronic device being electrically connected to the structure for making external electrical connection; and
   package encapsulant including an encapsulant material formed on the first surface of the substrate to enclose the electronic device, *wherein an inner end of* the degating region [being formed outside] *faces, but is spaced from, a plane of a sidewall of* the package encapsulant, [wherein:] *and*
   *wherein* the encapsulant material and the degating region material are chosen such that the adhesive force between the encapsulant material and the degating region material is less than the adhesive force between the encapsulant material and the substrate.

14. A substrate for use in forming a substrate-based packaged electronic device, wherein:
   a surface of the substrate is adapted for mounting an electronic device;
   further comprising:
      a degating region on the surface of the substrate at a location such that the edges of a mold runner of a mold used to encapsulate the electronic device in encapsulant material fit entirely within the degating region when the substrate is positioned in the mold during encapsulation of the electronic device, *wherein an edge of the degating region faces, but is spaced from, a plane of a sidewall of the encapsulant material after the encapsulation*; and
      a degating region material on the degating region, the degating region material being chosen such that the adhesive force between the encapsulant material and the degating region material is less than the adhesive force between the encapsulant material and the substrate.

*18. A substrate-based packaged electronic device as in claim 1, wherein an inner edge of the degating region faces, but is spaced from, an outer edge of the package encapsulant.*

*19. A substrate-based packaged electronic device as in claim 1, wherein a substantially rectilinear inner edge of the degating region faces, but is spaced from, a substantially rectilinear outer edge of the package encapsulant.*

* * * * *